United States Patent [19]
Conn et al.

[11] Patent Number: 5,999,714
[45] Date of Patent: Dec. 7, 1999

[54] METHOD FOR INCORPORATING NOISE CONSIDERATIONS IN AUTOMATIC CIRCUIT OPTIMIZATION

[75] Inventors: Andrew Roger Conn, Mount Vernon; Rudolf Adriaan Haring, Cortlandt Manor; Chandramouli Visweswariah, Croton-on-Hudson, all of N.Y.

[73] Assignee: International Business Machines Corporation, Armonk, N.Y.

[21] Appl. No.: 09/056,430

[22] Filed: Apr. 7, 1998

Related U.S. Application Data

[63] Continuation-in-part of application No. 08/825,278, Mar. 27, 1997, Pat. No. 5,886,908.
[51] Int. Cl.[6] .................................................. G06F 9/455
[52] U.S. Cl. .............................. 395/500.03; 395/500.35
[58] Field of Search ........................ 395/500.02, 500.03, 395/500.23, 500.34, 500.35; 364/488, 489, 490, 491, 578

[56] References Cited

U.S. PATENT DOCUMENTS

| | | | |
|---|---|---|---|
| 5,257,200 | 10/1993 | Machala, III et al. | 395/500.23 |
| 5,329,478 | 7/1994 | Kirk et al. | 395/500.03 |
| 5,369,594 | 11/1994 | Huang et al. | 395/500.08 |
| 5,381,361 | 1/1995 | Kirk et al. | 395/500.03 |
| 5,424,964 | 6/1995 | Machala, III et al. | 395/500.23 |
| 5,506,852 | 4/1996 | Chakradhar et al. | 395/500.03 |
| 5,682,322 | 10/1997 | Boyle et al. | 395/500.03 |
| 5,886,908 | 3/1999 | Conn et al. | 395/500.03 |

OTHER PUBLICATIONS

A. Conn et al., "Circuit Optimization via Adjoint Lagrangians", 1997 IEEE/ACM Int'l Conference on Computer–Aided Design, Digest of Technical Papers, 1997, pp. 281–288.

C. Visweswariah, "Optimization Techniques for High–Performance Digital Circuits", IEEE/ACM Int'l Conference on Computer–Aided Design, Digest of Technical Papers, 1997, pp. 198–207.

T. Nguyen et al., "Adjoint Transient Sensitivity Computation in Piecewise Linear Simulation", Proceedings of Design Automation Conference, 1998, pp. 447–482.

*Primary Examiner*—Kevin J. Teska
*Assistant Examiner*—Russell W. Frejd
*Attorney, Agent, or Firm*—F. Chau & Associates, LLP

[57] ABSTRACT

A method of incorporating noise considerations during circuit optimization includes the steps of: specifying a circuit schematic to be optimized; specifying at least one noise criterion as a noise measurement, including the signal to be checked for noise, the sub-interval of time of interest, and the maximum allowable noise deviation; providing each noise criterion as either a semi-infinite constraint or a semi-infinite objective function; specifying at least one variable of the optimization; converting the semi-infinite noise constraints and the semi-infinite noise objective functions into time-integral equality constraints; optionally, if required, providing additional optimization criteria other than noise as, for each such criterion, either objective functions or constraints; creating a merit function to be minimized to solve the optimization problem; simulating the circuit in the time-domain; computing the values of the objective functions and constraints; efficiently computing the gradients of the merit function of the optimizer (including contributions of all objective functions and constraints and the time-integrals representing noise considerations) preferably by means of a single adjoint analysis; iteratively providing the constraint values, the objective function values and the gradients of the merit function to a nonlinear optimizer; and continuing the optimization iterations to convergence.

23 Claims, 4 Drawing Sheets

FIG. 4C ced by inventive principles may include a central processor, operatively coupled to system memory (e.g., RAM, ROM, mass storage device), input devices (e.g, keyboard, keypad, mouse) and output devices (e.g., display, printer) via a computer bus. As is known, the software code may be stored in ROM or in the mass storage device and, as required, loaded into RAM and executed (run) by the central processor. Also, as is known, signals to be measured and/or otherwise processed may be input to the computer via one or more digital signal processors operatively coupled to the central processor. Of course, the above configuration is exemplary in nature and, thus, other computer architectures, as well as special purpose processors, may be employed to implement the present invention.

METHOD FOR INCORPORATING NOISE CONSIDERATIONS IN AUTOMATIC CIRCUIT OPTIMIZATION

CROSS REFERENCE TO RELATED APPLICATIONS

This application is a continuation-in-part of U.S. Ser. No. 08/825,278, filed Mar. 27, 1997, now U.S. Pat. No. 5,886,908 entitled: "Method of Efficient Gradient Computation," the disclosure of which is incorporated herein by reference.

BACKGROUND OF THE INVENTION

This invention relates to methods for incorporation of noise considerations during automatic circuit optimization.

In the context of digital circuits, noise is defined as any deviation of a signal from its stable value in those subintervals of time when it should otherwise be stable, as disclosed in the article by K. L. Shepard et al., "Noise in deep submicron digital design," IEEE International Conference on Computer-Aided Design, pp. 524–531, November 1996. Noise can cause a digital circuit to switch incorrectly and thus produce spurious results. Noise can also have adverse power, timing and reliability affects. Thus, the design and optimization of a circuit must take noise considerations into account.

Noise in digital circuits can be attributed to several sources such as leakage noise, charge-sharing noise, crosstalk noise, power supply noise, shot noise, thermal noise and flicker noise. Rigorous noise analysis and noise considerations during design are becoming increasingly important. The following trends in modern digital integrated circuit design accentuate the need for careful and detailed consideration of noise during circuit design and optimization: (1) supply voltages are being lowered, leading to smaller margins for noise; (2) transistor threshold voltages are being lowered, leading to higher levels of leakage noise; (3) circuits are being packed closer together, leading to more coupling and cross-talk noise; (4) signals have faster rise and fall times, leading to more power supply noise; and (5) the increased use of dynamic circuitry for performance reasons increases the susceptibility to noise problems.

When a circuit is optimized, noise must be considered in addition to such criteria as delay, power and area. The mathematical expression of noise considerations in circuit optimization is in the form of a nonlinear semi-infinite problem, a class of problems that is harder to solve than standard nonlinear optimization problems. In addition, the number of signals that must be checked for noise violations and the number of sub-intervals of time during which these checks must be performed are potentially very large. Hence, the incorporation of noise constraints and objective functions during practical circuit optimization is difficult and, hitherto, an unsolved problem.

SUMMARY OF THE INVENTION

In one aspect of the present invention, a method of gradient-based system optimization incorporating noise criteria comprises the steps of: specifying the system to be optimized; specifying at least one noise criterion including, for each criterion, a measurement to be checked for noise, maximum allowable deviation and a sub-interval of time during which the checking is performed; providing each noise criterion as a semi-infinite objective function to be either maximized or minimized or as a semi-infinite constraint to be met (preferably, more than one objective function and/or constraint is provided and, if required, the method may include specifying criteria other than noise criteria as objective functions and/or constraints); specifying at least one variable of the optimization; converting each noise objective function into a time-integral equality constraint by introduction of an auxiliary variable or converting each noise constraint into a time-integral equality constraint; generating a merit function in order to solve the optimization problem; simulating or solving the system to be optimized in the time-domain; computing values of the objective functions or constraints; computing gradients of the objective functions or constraints (again, there may preferably be more than one objective function and/or constraint), including contributions of the time-integrals representing the noise criteria; providing the constraint values or the objective function values and their gradients to a nonlinear optimizer; employing the nonlinear optimizer to update at least one variable of the optimization in order to improve the merit function; and continuing the optimization iterations to obtain improvement in the system being optimized.

While certain preferred implementations are mentioned and described herein, it is to be understood that the teachings of the invention may be implemented in hardware, software or a combination of both. Accordingly, the invention may be implemented as one or more software modules executed on one or more appropriately programmed general purpose digital computers. Each appropriately programmed general purpose digital computer may include, for example, a central processor, operatively coupled to system memory (e.g., RAM, ROM, mass storage device), input devices (e.g, keyboard, keypad, mouse) and output devices (e.g., display, printer) via a computer bus. As is known, the software code may be stored in ROM or in the mass storage device and, as required, loaded into RAM and executed (run) by the central processor. Also, as is known, signals to be measured and/or otherwise processed may be input to the computer via one or more digital signal processors operatively coupled to the central processor. Of course, the above configuration is exemplary in nature and, thus, other computer architectures, as well as special purpose processors, may be employed to implement the present invention.

Further, while a preferred purpose of incorporating noise considerations in accordance with the invention is for circuit optimization, such methods of incorporating noise constraints and functions may be utilized to substantially satisfy any purposes to which they may apply. For example, such optimization techniques incorporating noise considerations according to the invention may be applied to interference in radio systems and other types of transmission, vibration in mechanical systems, fluid flow in pipes, etc. Still further, while the preferred variables of the circuit optimization are transistor and wire sizes, the method applies to the optimization of any continuous design parameter such as spacing between wires. Still further, while the noise considerations are preferably posed as constraints, they can be stated as either objective functions or constraints or both. Still further, while the merit function may preferably be of the Lagrangian or augmented Lagrangian type, any type of merit function may be employed in accordance with the inventive teachings described herein including both barrier and penalty functions (referred to as interior and exterior techniques in "Nonlinear Programming: Sequential Unconstrained Minimization Techniques," by A. V. Fiacco and G. P. McCormick, John Wiley, 1968). Still further, while the preferred use of this invention is in the context of a dynamic (or time-domain-simulation-based) circuit optimizer, the teachings of this invention apply to other types of circuit optimization such as static-timing-based optimization and design for manufacturability. Still further, while the simulation of the nominal circuit and the adjoint analysis are preferably carried out in a fast event-driven circuit simulator, the teachings herein apply to any circuit analysis method. In addition, the optimization problem may comprise at least one objective function or at least one constraint; however, the invention is applicable to any number of objective functions in combination with any number of constraints. Still further, while the gradients of the merit function are preferably computed by means of a single adjoint analysis, the gradients can be computed by any other method, adjoint or otherwise. Still further, while the present invention expresses noise criteria in terms of maximum allowable deviation of a signal from a given level, other noise criteria, such as noise pulse width or gain-based criteria, can be accommodated. Finally, while the optimization iterations are preferably carried to convergence, the teachings herein apply to any iterative improvement of the circuit.

Such teachings described herein may advantageously have varied application. For example, the present invention may be applied to any digital system, analog system, microprocessor design, array design and package design. However, while these and other applications are suggested within this disclosure, the present invention is not limited only to those mentioned and, as such, one of ordinary skill will contemplate many other varied applications.

In another aspect of the present invention, a method of incorporating noise considerations during circuit optimization includes the steps of: specifying a circuit schematic to be optimized; specifying noise criteria for the circuit to meet, including signals to be checked for noise, maximum allowable deviations and the sub-intervals of time during which the checking is to be performed; providing each noise criterion as a semi-infinite objective function or a semi-infinite constraint (optionally specifying criteria other than noise criteria for optimization in terms of objective functions or constraints); specifying at least one variable (but preferably, many variables may be specified) of the optimization; converting each semi-infinite noise constraint into a time-integral equality constraint or converting each semi-infinite noise objective function into a time integral equality constraint by introduction of an auxiliary variable; creating a merit function to solve the optimization problem; simulating the circuit in the time-domain; computing the values of the objective functions or constraints; efficiently computing the gradients of the merit function of the optimizer (including contributions of the time-integrals representing noise considerations) by a single adjoint analysis as disclosed by A. R. Conn, R. A. Haring and C. Visweswariah in the above-incorporated U.S. Ser. No. 08/825,278, filed Mar. 27, 1997, entitled: "Method of Efficient Gradient Computation" and described in the section entitled: "Single Adjoint Analysis"; iteratively providing the constraint values, or the objective function values and the gradients of the merit function to a nonlinear optimizer; and iteratively improving the circuit according to the optimization criteria.

Accordingly, in a more specific aspect of the present invention, a method of incorporating noise considerations during circuit optimization includes the steps of: specifying a circuit schematic to be optimized; specifying noise criteria for the circuit to meet, including signals that must be checked for noise, maximum allowable deviations and the sub-intervals of time during which the checking is to be performed (optionally specifying the delay, power, area and rise/fall time criteria for optimization in terms of objective functions or constraints); providing each noise criterion as a semi-infinite constraint or as a semi-infinite objective function; specifying at least one variable of the optimization such as transistor or wire size (but preferably, many variables may be specified); converting each semi-infinite noise constraint or objective function into a time-integral equality constraint (in the case of the objective functions, the converting step is accomplished by introduction of an auxiliary variable); creating an augmented Lagrangian merit function which is to be minimized to solve the optimization problem; simulating the circuit in the time-domain by means of a fast event-driven circuit simulator; computing the value of the objection functions or constraints; efficiently computing the gradients of the augmented Lagrangian merit function, including contributions of the time-integrals representing noise, by a single adjoint analysis performed by the fast simulator; providing the constraint values, or the objective function values and the gradients of the merit function to a nonlinear optimizer; and continuing the optimization iterations to convergence.

It is to be appreciated that while certain of the above-described methods of the invention are described in terms of alternatively providing each noise criterion as either a semi-infinite objective function or a semi-infinite constraint, the invention extends to the provision of more than one objective function or constraint, as well as single and multiple combinations thereof.

It is to be appreciated that circuit optimization incorporating noise considerations is typically stated as a nonlinear semi-infinite problem, a problem that is harder to solve than a standard nonlinear optimization problem. It is to be further appreciated that the number of signals that must be checked for noise and the number of sub-intervals during which such checks must be carried out can potentially be very large. Due to the fact that the present invention remaps the semi-infinite problem to ordinary time-integrals that are readily computed after the simulation step and due to the fact that the present invention preferably employs a single adjoint analysis to efficiently find all the gradients required for optimization (including the contributions of the noise criteria), the computational complexity (including the computational resources to perform the calculations, as well as the computational run time) is substantially reduced, thereby overcoming the disadvantages associated with prior art procedures and thereby rendering such a circuit optimization method practical.

These and other objects, features and advantages of the present invention will become apparent from the following detailed description of illustrative embodiments thereof, which are to be read in connection with the accompanying drawings.

DETAILED DESCRIPTION OF PREFERRED EMBODIMENTS

Figure 1:
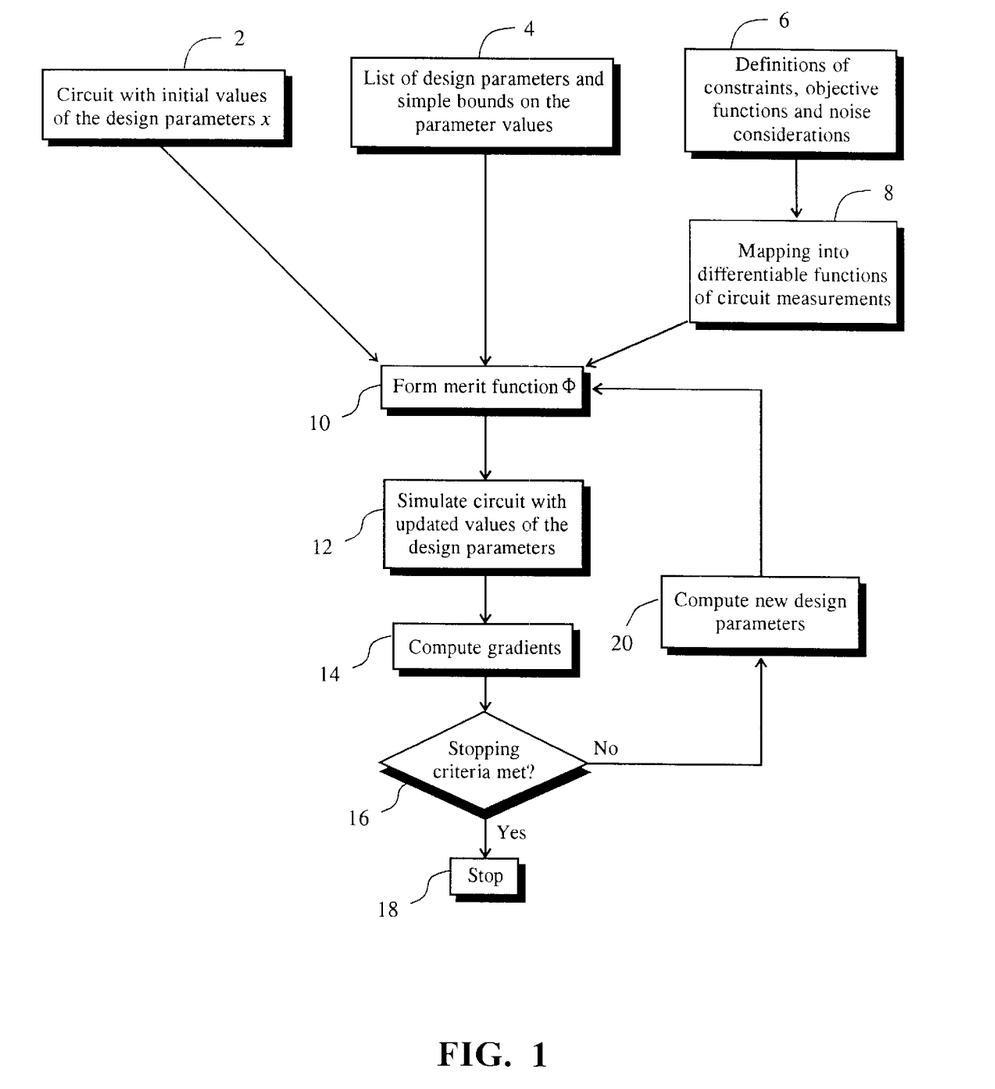
FIG. 1 is a flowchart illustrating a generalized method of circuit optimization including noise considerations according to the invention.

Referring initially to FIG. 1, a generalized method of gradient-based circuit optimization is shown in flowchart form. It is to be appreciated that, as explained above, such a generalized method of gradient-based circuit optimization may be implemented on one or more appropriately programmed general purpose computers. As such, an optimizer capable of performing such method of circuit optimization may be implemented in hardware, software, or a combination thereof. Thus, given the inputs in blocks 2, 4 and 6, circuit optimization may be performed. First, a circuit with initial values of the design parameters associated with the circuit is provided (block 2). The design parameters are represented as $x_i$, where i=1,2, . . . n. Design parameters are the values that are adjusted during optimization, e.g., transistor widths, wire sizes, resistance values and capacitance values. Further, a list is provided of design parameters and simple bounds (including possibly $-\infty$ and $+\infty$) on the values that each parameter is allowed to take (block 4). For example, the lower bound on a transistor width may be determined by the technology limit to be 0.5 micrometer, below which the device ceases to function as a transistor. Lastly, definitions of the constraints and objectives of the optimization problem are provided, expressed in terms of circuit measurements (block 6). Circuit measurements are observable responses of the circuit, e.g., delays, slews, power dissipation, voltage and current waveforms, area and noise deviations associated with signals which are measurable at various points in the circuit. For example, the optimization problem may be to minimize the difference between two delays while satisfying constraints on slews, total area, power dissipation and noise. Since the optimization method requires that the objective functions and constraints be differentiable functions of circuit measurements, a mapping step is required (block 8) to cast the user-specified objectives and constraints into differentiable functions. Such is the case with the noise considerations that are the subject of the invention, as will be explained below.

Given the above inputs, the following steps are carried out in order to optimize the subject circuit. First a merit function $\Phi$ is formed (block 10). A merit function is an internal function computed by the optimizer to evaluate the "goodness" (i.e., merit) of a solution. In nonlinear optimizers, general constraints are often accommodated by constructing and finding a stationary point of a Lagrangian merit function as disclosed in the text by J. L. Lagrange, "Oeuvres de Lagrange," Vols. XI and XIII, Gauthier-Villars, Paris, 1888–1889, or an augmented Lagrangian merit function as disclosed in the article by M. R. Hestenes, "Multiplier and Gradient Methods," Journal of Optimization Theory and Applications, pp. 303–320, Vol. 4, 1969 and in the chapter by M. J. D. Powell, "A Method for Nonlinear Constraints in Minimization Problems," in Optimization, R. Fletcher (ed.), Academic Press, London and New York, 1969. However, as will be explained, the methods of this invention can be applied to these and other merit functions as well.

The next step is to simulate the circuit to determine the values of all the measurements, and hence the constraint and objective function values (block 12). Typically this computation is achieved by running a circuit simulator.

Next, the gradients of the merit function $\Phi$ are computed with respect to the design parameters, e.g., $\partial\Phi/\partial x_i$, i=1,2, . . . , n (block 14). A preferred method for gradient computation is the one disclosed by A. R. Conn, R. A. Haring and C. Visweswariah in the above-incorporated U.S. Ser. No. 08/825,278, filed Mar. 27, 1997, entitled: "Method of Efficient Gradient Computation" as described below in the section entitled "Single Adjoint Analysis." However, it is to be understood that any other method that computes the required gradients can be used.

Nonetheless, if the stopping criteria are met (block 16) then the procedure is stopped (block 18). For a problem without constraints, the stopping criterion is that the gradient of the objective function be zero (or in practice, sufficiently small). The corresponding criterion for a problem with equality constraints is that the constraints be satisfied and that the projection of the objective function on to the constraint manifold be sufficiently small (i.e., approximately zero). However, it is to be understood that, depending on the application, the stopping criteria may also be that the gradient of the objective function (or projection thereof) is less than a predetermined constant. If the criteria are not met (block 16), based on the function and gradient values, new design parameters are computed (block 20) that are expected to improve the merit function, and the procedure returns to block 10 to repeat the steps therefrom, iterating until convergence, that is, the stopping criteria being met.

It is understood that while the present invention substantially focuses on a practical method of incorporating electrical noise considerations in the circuit optimization framework described above, the present invention encompasses a complete gradient-based circuit optimization procedure which utilizes the method of incorporating noise considerations described herein.

The remainder of the detailed description is structured in the following manner. A preferred method of the present invention for incorporating noise considerations into circuit optimization is first demonstrated by means of an example. A particular circuit, a specific optimization problem and a Lagrangian merit function are assumed in the example. Then, the concepts taught by the present invention are extended to any circuit and any optimization problem, and to any general merit function, as well as to other systems amenable to a similar analysis.

Figure 2A:
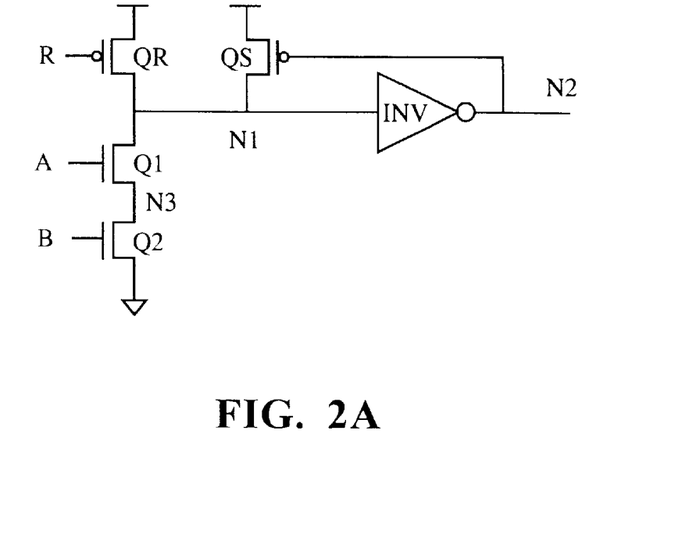
FIGS. 2A and 2B are, respectively, a schematic of a sample dynamic circuit that is susceptible to charge-sharing noise and signal waveforms associated therewith.
Figure 2B:
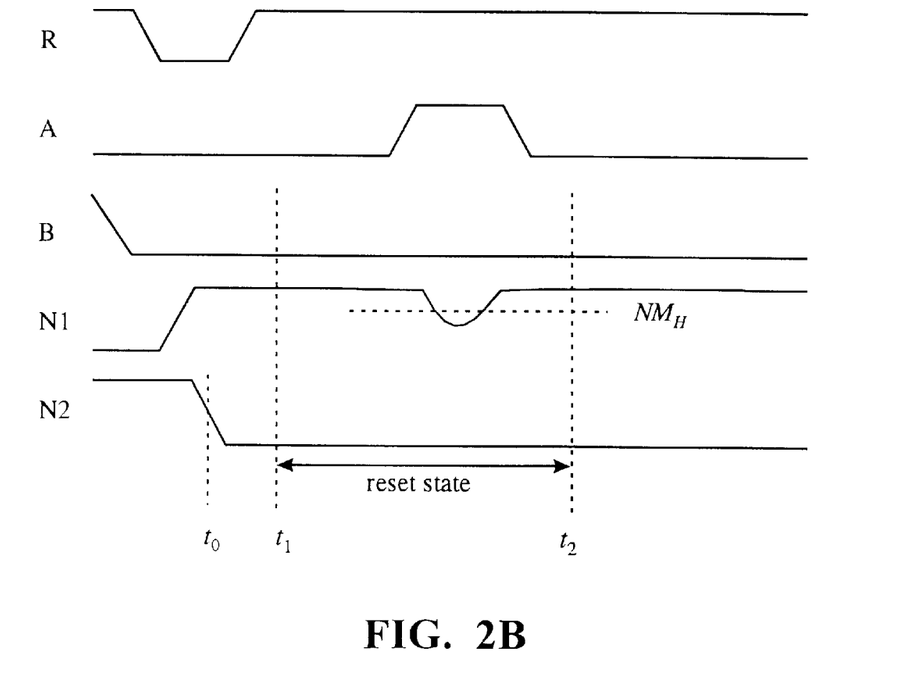

The following is an example used to demonstrate the teachings of the present invention. FIG. 2A shows a CMOS dynamic circuit susceptible to charge-sharing noise. The circuit performs a logical AND function of the two input signals A and B, i.e., N2=A AND B. The waveforms for each input signal, A, B and R are shown in FIG. 2B. The first arriving active-low pulse on input R activates transistor QR to pull up internal node N1, which in turn switches the output node N2 to a low state. This state is called the reset state. The subsequently incident active-high pulse on input A switches transistor Q1 on, but, since input B remains low, the nodes N1 and N2 are not supposed to switch logical state. In other words, it is the intent that the circuit maintains the reset state in the case of these particular input waveforms.

However, since transistor Q1 was switched on, it opened a conductive path between nodes N1 and N3. If, due to previous switching history, node N3 were in a low state, then the charge on node N1 will partially flow to node N3 until both nodes have reached an equilibrium voltage, which is between the initially high state of node N1 and the initially low state of node N3, and the value of which is determined by the relative capacitances associated with nodes N1 and N3. This phenomenon is known as "charge-sharing." The resulting dip in voltage at node N1 is schematically indicated in its related waveform in FIG. 2B, and is known as "charge-sharing noise." Since node N2 is low, the small stand-by transistor QS is on. QS will try to counteract the voltage dip on node N1 and will try to eventually restore both node N1 and node N3 to the high state.

For the circuit to function as intended, it is imperative that transistors are sized in such a way that the voltage dip on node N1 does not cause the output inverter INV to switch. To ensure that the inverter output is stable, the magnitude of the noise dip in the waveform on node N1 needs to be within the allowed noise margin of the inverter. This noise margin level is indicated as level $NM_H$ in FIG. 2B.

Assume that a possible optimization problem for this circuit is as follows:

$$\min_{x} t_0(x) \tag{1}$$

subject to $v_{NI}(x, t) \geq NM_H$ for the time period $t_1 \leq t \leq t_2$, where $t_0(x)$ is the 50% crossing point of the falling voltage transition on node N2 and $v_{N1}$ is the voltage at node N1, which is a function of the optimization variables (tunable parameters) x and time t. Assume that the variables of optimization are the widths of the six transistors in FIG. 2A (two being inside the inverter and not shown). The transistor widths are denoted as $x_i$, i=1,2, . . . ,6, collectively known as x. An initial value and simple bounds on each variable are specified.

Equation (1) describes a semi-infinite problem, which is not amenable to a practical solution using known techniques. In particular, the second line of the equation expresses a semi-infinite constraint. However, the present invention teaches that we can map the problem of Equation (1) to an equivalent problem:

$$\min t_0 \tag{2}$$

subject to $c(x) = \int_{t_1}^{t_2} \max(NM_H - v_{NI}(x, t), 0) dt = 0$, wherein the semi-infinite noise constraint of Equation (1) has been transformed into an equality constraint involving the time integral c(x).

Further, assume that in order to solve the problem, a Lagrangian merit function $\Phi$ is formed as follows:

$$\Phi = t_o + \lambda c(x), \tag{3}$$

where $\lambda$ is the Lagrange multiplier or dual variable. Once the circuit being optimized is simulated in the time-domain, the integral c(x) is readily computed since the simulation involves the discretization of time and $v_{N1}(x,t)$ is computed during the simulation. Therefore, $\Phi$ is easily computed from Equation (3). In order to find a stationary point of $\Phi$, we must compute the gradients of $\Phi$, i.e., $\partial \Phi/\partial x$, as explained above in block 14 (FIG. 1).

The component $\partial t_o/\partial x$ of $\partial \Phi/\partial x$ can be calculated by any conventional applicable method.

Figure 3:
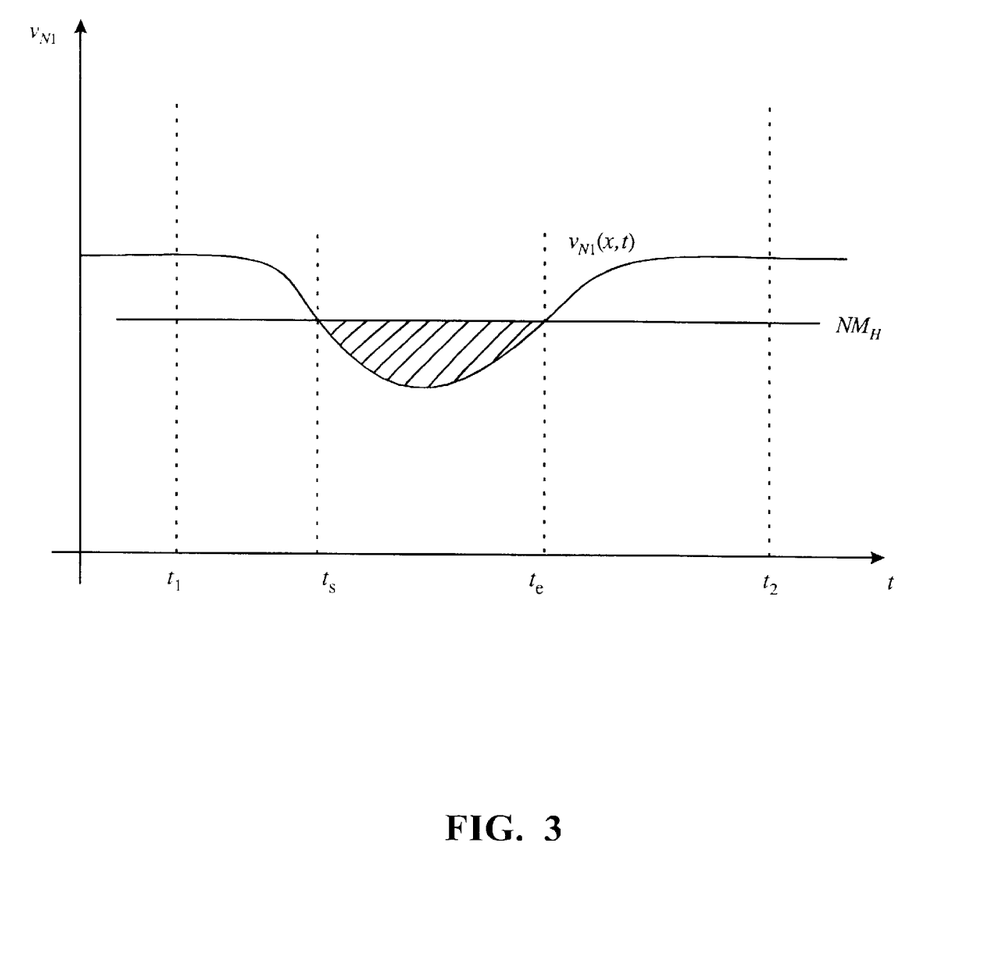
FIG. 3 is a graphical representation illustrating a signal that has a noise spike in a sub-interval of time when the signal should be stable.

The method of computation for $\partial c/\partial x$ is elaborated with reference to FIG. 3. In FIG. 3, the noise integral c(x) of Equation (2) is represented by the shaded area, which is the integral of that portion of the voltage waveform where the signal deviation exceeds the specified noise margin level $NM_H$. It is an objective of the optimization, specifically determining a stationary point of $\Phi$ as expressed in Equation (3), to reduce this area to zero, which is equivalent to bringing the value of the voltage within the specified noise margin level for any point within the time interval under consideration. It is to be appreciated, with reference to FIG. 3, that the noise integral c(x) of Equation (2) can be rewritten as follows:

$$c(x) = \int_{t_1}^{t_2} \max(NM_H - v_{N1}(x,t), 0) dt = \int_{t_s}^{t_e} (NM_H - v_{N1}(x,t)) dt, \tag{4}$$

and the gradient of the noise integral:

$$\frac{\partial c(x)}{\partial x} = \frac{\partial}{\partial x} \int_{t_s}^{t_e} (NM_H - v_{NI}(x, t)) dt \tag{5}$$

$$= \int_{t_s}^{t_e} -\frac{\partial}{\partial x} v_{NI}(x, t) dt,$$

where $t_s$ and $t_e$ are the start and end times of the unwanted signal deviation beyond the noise margin. Note that $t_e$ and $t_s$, themselves, are functions of the tunable parameters of the circuit, and hence will change from iteration to iteration of the optimization.

Equation (5) is derived keeping in mind that either $v_{N1}(x,t_s) = NM_H$ or $t_s = t_1$ and that similarly either $v_{N1}(x,t_e) = NM_H$ or $t_e = t_2$. The times $t_1$ and $t_2$ are constants and not functions of x. Note also that by rewriting the noise constraint as in Equation (4), we have mapped the original noise constraint into a differentiable equality constraint (see block 8 of FIG. 1).

Thus the computation of the quantities of Equations (4) and (5) is comprised of the following steps:

(1) Find, within the interval $t_1$ to $t_2$, the subinterval $t_s$ to $t_e$ where the voltage deviation exceeds the specified noise margin. There may be several such sub-intervals, but for demonstration of the principles of the invention we assume only one.

(2) For calculation of the merit function $\Phi$, compute the contribution of the noise integral according to Equation (4) from the waveform $v_{N1}(x,t)$ as found in the time-domain simulation for a given set of optimization variables, x. Since simulation involves discretization of time and the computation of $v_{N1}(x, t)$ for $t_1 \leq t \leq t_2$, the integral is readily computed.

(3) For calculation of the gradient of the merit function $\partial \Phi/\partial x$, compute the contribution of the derivative of the noise integral according to Equation (5).

It is noted that time integrals like Equation (4) are particularly suited to adjoint gradient computations in the time-domain. In particular, using a preferred method of gradient computation as disclosed by A. R. Conn, R. A. Haring and C. Visweswariah in the above-incorporated U.S. Ser. No. 08/825,278, filed Mar. 27, 1997, entitled: "Method of Efficient Gradient Computation" and described below in the section entitled "Single Adjoint Analysis," the gradient of the merit function can be computed efficiently by means of a single adjoint analysis. Therefore, finding the gradient of the merit function $\Phi$, including the contribution of c(x), can be performed efficiently by means of a single analysis, irrespective of the number of measurements and irrespective of the number of tunable parameters. Hence, gradient computation, even in the presence of a large number of noise considerations, can be carried out with a negligibly small computational overhead.

It is to be appreciated that a substantial advantage of this invention is that the noise integral c(x) and its derivatives can be efficiently computed.

As noted above, a single noise constraint expressed over a single time interval $t_1 \leq t \leq t_2$ may encompass more than one subinterval, such as $t_s \leq t \leq t_e$, where the node voltage exceeds the specified noise margin. In such a case, a contribution of the form of Equation (4) and Equation (5) is formed for each such subinterval, and the constraint and its gradient are expressed as summations of multiple time integrals.

While the preceding description demonstrates the incorporation of noise constraints based on a simple example, the concept can be applied to any circuit, with any optimization merit function and with any number of general noise criteria, as described below. Consider a circuit optimization problem in which noise criteria appear both as an objective function and as constraints and in which the goal is not only to constrain, but also to minimize noise above a certain level over a given time interval:

$$
\begin{aligned}
&\text{minimize} && \text{maximum} && \text{maximum } \{(v_0(x, t) - k_{2_0}), 0\} \\
&\quad x && t_{1_0} \leq t \leq t_{2_0} \\
&\text{subject to} && c_{e_i}(x) = 0, && i = 1, 2, \ldots, E \\
&\text{subject to} && c_{l_i}(x) \leq 0, && i = 1, 2, \ldots, L \\
&\text{subject to} && c_{g_i}(x) \geq 0, && i = 1, 2, \ldots, G \\
&\text{subject to} && k_{1_n} v_n(x, t) \leq k_{2_n} && \text{for all } t_{1_n} \leq t \leq t_{2_n}, n = 1, 2, \ldots, N.
\end{aligned} \quad (6)
$$

The variables of the problem are denoted by x, $\{v_0(x,t)-k_{2_o}\}$ is a noise function whose positive deviation from zero we wish to minimize, $c_e$, $c_l$ and $c_g$ are E, L and G equality, less-than and greater-than constraints, respectively, expressed in terms of the circuit measurements. Each of N noise constraints has four constants associated with it, $k_{1_n}$, $k_{2_n}$, $t_{1_n}$ and $t_{2_n}$. For a signal that should be at a stable logical low, typically $k_{1_n}=-1$ and $k_{2_n}=-NM_H$. For a signal that should be at a stable logical high, typically $k_{1_n}=-1$ and $k_{2_n}=-NM_H$.

Problem (6) above is remapped to:

$$\underset{x,z}{\text{minimize}} \; z \qquad (7)$$

subject to $z \geq \max\{v_0(x, t) - k_{2_o}, 0\}$ for all $t_{1_o} \leq t \leq t_{2_o}$ subject to $c_{e_i}(x) = 0, i = 1, 2, \ldots, E$ subject to $c_{l_i}(x) \leq 0, i = 1, 2, \ldots, L$ subject to $c_{g_i}(x) \geq 0, i = 1, 2, \ldots, G$ subject to $k_{1_n} v_n(x, t) \leq k_{2_n}$ for all $t_{1_n} \leq t \leq t_{2_n}, n = 1, 2, \ldots, N.$ This is in turn reformulated as:

$$\underset{x,z}{\text{minimize}} \; z \qquad (8)$$

subject to $$c_0(x, z) = \int_{t_{1_o}}^{t_{2_o}} \min([z - \max(v_0(x, t) - k_{2_o}, 0)], 0) dt = 0,$$

subject to $z \geq 0$ subject to $c_{e_i}(x) = 0, i = 1, 2, \ldots, E$ subject to $c_{l_i}(x) \leq 0, i = 1, 2, \ldots, L$ subject to $c_{g_i}(x) \geq 0, i = 1, 2, \ldots, G$ subject to $$c_n(x) = \int_{t_{1_n}}^{t_{2_n}} \max(k_{1_n} v_n(x, t) - k_{2_n}, 0) dt = 0,$$

$n = 1, 2, \ldots, N,$ and the problem is posed to the nonlinear optimizer as one involving ordinary constraints. The introduced variable z requires initialization, typically at some value that approximates the maximum of $\{v_0(x,t)-k_{2_o}, 0\}$ for the initial value x over the interval $[t_{1_o}, t_{2_o}]$. At each iteration of the optimization, the circuit being optimized is simulated in the time-domain to determine all the measurements of the system. Further, the waveforms $v_n(x,t)$, n=0,1, ...,N are computed for the intervals of time $t_{1_n} \leq t \leq t_{2_n}$. In each such interval, the corresponding waveform is checked to determine the sub-intervals $$t_{s_{n_j}} N = t \leq t_{e_{n_j}},$$

j=0,1, ..., $J_n$ during which $z \leq \max(v_0(x,t)-k_{2_o}, 0)$ or $k_{1_n} v_n(x,t)-k_{2_n} > 0$, n=1,2, ... N. If the noise objective function or any of the noise constraints involves no such sub-intervals, then the corresponding $c_n$ and its gradients are identically zero. If not, $c_n$ for this iteration of the optimization may be written as:

$$c_0(x, z) = \sum_{j=1}^{J_0} \int_{t_{s_{0_j}}}^{t_{e_{0_j}}} (z - v_0(x, t) + k_{2_0}) dt, \qquad (9)$$

or $$c_n(x) = \sum_{j=1}^{J_n} \int_{t_{s_{n_j}}}^{t_{e_{n_j}}} (k_{1_n} v_n(x, t) - k_{2_n}) dt, \quad n = 1, 2, \ldots, N, \qquad (10)$$

and thus easily computed since time is discretized during the time-domain simulation and the voltage waveforms are known. At this point, the original noise objective function has been mapped into a differentiable equality constraint and an objective function comprising of a newly introduced variable and each original noise constraint has been mapped into a differentiable equality constraint (the step shown in block 8 of FIG. 1).

The next step is to compute the gradients of the merit function of the optimizer. One way to do so is to compute the gradient of each of the objective functions and constraints. The gradients of the regular constraints ($c_e$, $c_l$ and $c_g$) are computed by any applicable means. The gradients of the noise constraints of the reformulated problem, $c_n$, are written (defining $k_{1_0}=-1$) as:

$$\frac{\partial c_n}{\partial x} = k_{1_n} \sum_{j=1}^{J_n} \int_{t_{s_{n_j}}}^{t_{e_{n_j}}} \frac{\partial v_n(x, t)}{\partial x} dt, \qquad (11)$$

n = 0, 1 ..., N and for all x, with $$\frac{\partial c_0}{\partial z} = \sum_{j=1}^{J_0} \left(t_{e_{0_j}} - t_{s_{0_j}}\right), \cdot$$

Although $$t_{s_{n_j}}, t_{e_{n_j}},$$

Z and $J_n$ are functions of x and change from iteration to iteration, Equation 11 above is valid since for each sub-interval, in the case when either $v_0(x, t_{s_{0_j}}) - k_{2_0} - z = 0$ or $t_{s_{0_j}} = t_{1_0}$ (12)

and either $v_0(x, t_{e_{0_j}}) - k_{2_0} - z = 0$ or $t_{e_{0_j}} = t_{2_0}$ (13)

or otherwise either $k_{1_n} v_n(x, t_{s_{n_j}}) - k_{2_n} = 0$ or $t_{s_{n_j}} = t_{1_n}$ (14)

and either $k_{1_n} v_n(x, t_{e_{n_j}}) - k_{2_n} = 0$ or $t_{e_{n_j}} = t_{2_n}$. (15)

Note that $t_{1_n}$ and $t_{2_n}$, n=0,1, . . . N, are not functions of x.

Since the right hand side of Equation (11) is a time integral of a voltage gradient, it is amenable to efficient computation by the adjoint method. The procedure involves attaching a zero-valued current source at each node that has a noise constraint during the nominal transient analysis. During the adjoint analysis, an appropriately scaled pulse of current is applied through this current source in the sub-intervals of time $$t_{s_{n_j}} \le t \le t_{e_{n_j}}, j = 0, 1, \ldots, J_n.$$

The gradients are preferably computed by a single adjoint analysis, applying the teachings of A. R. Conn, R. A. Haring and C. Visweswariah in the above-incorporated and described U.S. Ser. No. 08/825,278, filed Mar. 27, 1997, entitled: "Method of Efficient Gradient Computation" as described below in the section entitled "Single Adjoint Analysis." In this situation, the $c_n(x)$ constraints are treated as ordinary equality constraints. At each iteration, $c_n(x)$ n=0, 1, . . . ,N is expressed as a summation of time integrals (Equations 9 and 10) and a single adjoint analysis is applied to obtain the gradients of the merit function of the optimizer by appropriate choices of adjoint excitations.

In the case where the optimization merit function does not involve any semi-infinite component, the optimization merit function can be dealt with directly. In addition, we note that the following cases can also be handled:

(1) where an objective function requires that one maximizes the minimum value of a signal below a noise margin for a specified time interval;

(2) where the objective is to minimize, $|v_0(x,t)-k_{2_0}|$, i.e., the deviation to either side of a specified level for a specified time interval;

(3) where the objective is to minimize simply $v_0(x,t)$ for a specified time interval.

Thus the method of incorporating noise criteria applies to any circuit, any number of noise constraints and noise objective functions and any number of unwanted signal deviations during the time period of each noise criterion. Further, the computation of gradients by means of a single adjoint analysis can be applied irrespective of the number of measurements, the number of ordinary constraints or objective functions, the number of noise constraints and the number of noise objective functions. Furthermore, the teachings of the present invention may be extended to any differentiable merit function, as taught by A. R. Conn, R. A. Haring and C. Visweswariah in the above-incorporated U.S. Ser. No. 08/825,278, filed Mar. 27, 1997, entitled: "Method of Efficient Gradient Computation" and described below in the section entitled "Single Adjoint Analysis."

Still further, the teachings of the present invention are also applicable to gradient-based optimization (e.g., linear or nonlinear, static or dynamic) in which the deviations of some measurements of the system need to be limited during given intervals of time, or any variable that is discretized during the simulation of the system such as frequency.

Preferably, the system may be modeled by a set of equations consisting of at least one of the following: a nonlinear set of equations, a linear set of equations, a set of linear partial differential equations, a set of nonlinear partial differential equations, a set of linear differential algebraic equations and a set of nonlinear differential algebraic equations.

Nonetheless, the system of interest may be a network and, preferably, may be a digital electrical circuit. However, it may alternatively be an analog electrical circuit.

Single Adjoint Analysis

As previously mentioned, gradient computation is preferably performed in accordance with the methods disclosed by A. R. Conn, R. A. Haring and C. Visweswariah in the above-incorporated U.S. Ser. No. 08/825,278, filed Mar. 27, 1997, entitled: "Method of Efficient Gradient Computation." In such a preferred method, the gradient computation is accomplished as follows: an adjoint circuit is constructed, which is topologically identical to the circuit under consideration, but whose branches are configured according to adjoint relations, as disclosed in the article by S. W. Director et al., "The Generalized Adjoint Network and Network Sensitivities," IEEE Transactions on Circuit Theory, pp. 318–323, vol. CT-16, no. 3 (August 1969). This adjoint circuit is then stimulated with a set of appropriately weighted and timed excitations so that the gradient of the merit function $\Phi$ with respect to the optimization parameters can be determined in a single analysis, irrespective of the number of individual circuit measurements that constitute $\Phi$, and irrespective of the number of optimization parameters.

Figure 4A:
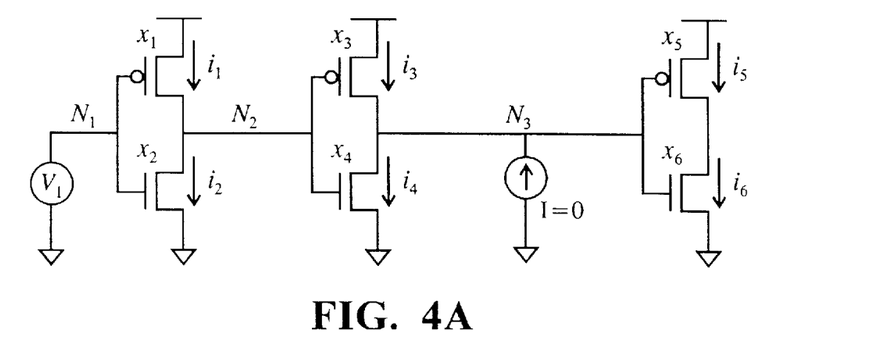
FIGS. 4A through 4C are, respectively, schematic diagrams of a nominal circuit, an adjoint circuit and signal waveforms associated therewith, used to illustrate a preferred method of gradient computation.

The following is an example used to demonstrate such a preferred method of gradient computation. FIG. 4A shows a nominal circuit consisting of three CMOS inverters driven by a voltage source $V_1$. The input waveform of $V_1$ is shown in FIG. 4C (labeled as $N_1$) along with the voltage waveform on the internal node $N_3$ (labeled as $N_3$). The measurements $t_1$ and $t_2$ (FIG. 4C) are the 50% crossing points of the voltage on node $N_3$, as measured by the voltmeter (zero-valued current source) attached to $N_3$. Assume that the optimization problem for which we are computing gradients is as follows:

minimize $t_1$ (16)

subject to $t_2 = T$, where T is a constant target time. Assume that the variables of the problem are the widths of the six transistors $x_i$, i=1,2, . . . ,6, and an initial value and simple bounds on each variable are specified. Further assume that in order to solve the problem, a Lagrangian merit function $\Phi$ is formed as follows:

$$\Phi = t_1 + \lambda(t_2 - T),$$ (17)

where $\lambda$ is the Lagrange multiplier or dual variable. In order to minimize $\Phi$, we must compute the gradients of $\Phi$, i.e., $\partial\Phi/\partial x_i$, i=1,2, . . . ,6, as explained above in block 14 (FIG. 1).

It is to be appreciated that, in accordance with adjoint circuit analysis, the following procedure is performed. First, the nominal circuit is simulated and the necessary waveforms are stored. The simulation may be carried out by employing a circuit simulator. A conventional incremental-in-time simulator like SPICE (Simulation Program with Integrated Circuit Emphasis) as disclosed in the article by L. W. Nagel, SPICE2: A Computer Program to Simulate Semiconductor Circuits, Memo UCB/ERL M520, University of California, Berkeley, (May 1975), or a piecewise approximate simulator such as SPECS (Simulation Program for Electronic Circuits and Systems), as disclosed in the article by C. Visweswariah et al., "Piecewise Approximate Circuit Simulation," IEEE Transactions on Computer-Aided Design of Integrated Circuits and Systems, pp. 861–870, vol. CAD-10 (July 1991), may be used. These simulators formulate and solve the nonlinear differential algebraic equations associated with the circuit. Circuit simulation is preferably performed by employing a piecewise approximate simulator such as the SPECS circuit simulator. The simplification of the device models, along with an event-driven simulation algorithm, causes such a class of simulators to be much faster than simulators such as SPICE.

Figure 4B:
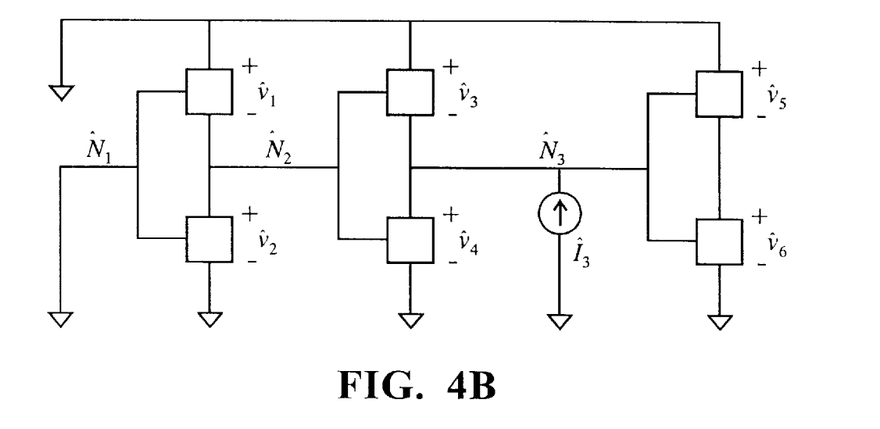
Figure 4C:
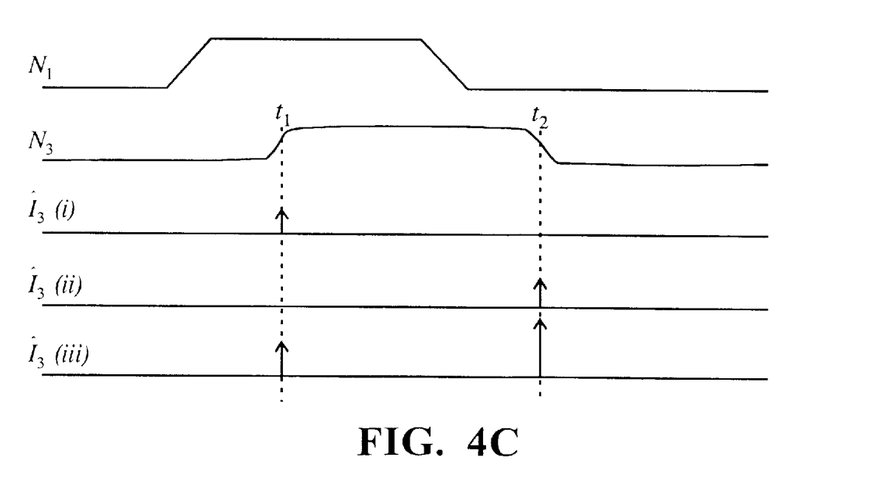

Next, the adjoint circuit may be constructed as shown in FIG. 4B. The adjoint circuit is topologically identical to the nominal circuit, but the branch characteristics of the devices are chosen so that the solution of the circuit yields the necessary sensitivities (i.e., gradients). For example, as shown in FIG. 4B, independent voltage sources are shorted in this example (i.e., the input signal and power supply have been grounded). Adjoint circuit quantities are denoted with a carat symbol, ^, placed over the quantity (e.g., $N_1$ in the nominal circuit corresponds to $\hat{N}_1$ in the adjoint circuit).

According to prior art, to compute $\partial t_1/\partial x_i$, the adjoint circuit is driven by a current source at node $\hat{N}_3$ (corresponding to the measurement point $N_3$ in the nominal circuit) with a unit Dirac impulse at time $t_1$, as shown by waveform $\hat{I}_3(i)$ in FIG. 4C. Then the adjoint circuit is solved while running time backwards from time $t_{max}$ to 0 where $t_{max}$ is the simulation interval of the nominal circuit. The required sensitivities, $\partial t_1/\partial x_i$, are proportional to the convolution integrals: $\int_0^{t_{max}} v_i(\tau) i_i(t_{max}-\tau) d\tau, i=1,2,\ldots,6$,
where the current waveforms $i_i(t)$ are taken from the nominal circuit (FIG. 4A) and the $\hat{v}_i(\tau)$ are the adjoint circuit (FIG. 4B) branch voltages. Piecewise approximate simulators lend themselves well to the application of Dirac impulse stimuli and efficient computation of convolution integrals. Now, to compute $\partial t_2/\partial x_1$, the prior art gradient computation method teaches that the above procedure is repeated, but with a unit Dirac impulse at $t_2$ in $\hat{I}_3$, as shown by waveform $\hat{I}_3(ii)$ in FIG. 4C. The adjoint circuit is solved and convolutions carried out as explained above.

Finally, the required gradients are assembled from the results yielded by the above-described computations of $\partial t_1/\partial x_i$ and $\partial t_2/\partial x_i$, and are represented as follows:

$$\frac{\partial \Phi}{\partial x_i} = \frac{\partial}{\partial x_i}[t_1 + \lambda(t_2 - T)] = \frac{\partial t_1}{x_i} + \lambda \frac{\partial t_2}{\partial x_i}, \quad i = 1, 2, \ldots, 6. \quad (18)$$

Thus, two solutions in this example (or as many solutions as the number of measurements in general) of the adjoint circuit are needed. During the computation of each solution, a convolution integral must be computed for each design parameter.

However, in accordance with the method of gradient computation disclosed by A. R. Conn, R. A. Haring and C. Visweswariah in the above-incorporated U.S. Ser. No. 08/825,278, filed Mar. 27, 1997, entitled: "Method of Efficient Gradient Computation", it is advantageously recognized that Equation (18) may be represented as follows:

$$\frac{\partial \Phi}{\partial x_i} \frac{\partial}{\partial x_i}[t_1 + \lambda t_2], \quad i = 1, 2, \ldots, 6, \quad (19)$$

whereby Equation (19) represents the sensitivity of a scalar combination of measurements. Since the merit function is a scalar function, such a preferred method teaches that the sensitivity (i.e., gradient) of the merit function can be found by a single adjoint analysis, that is, the gradients with respect to all design parameters may be simultaneously calculated by a single adjoint analysis. In this particular example, $\hat{I}_3$ is constructed to have two Dirac impulses at times corresponding to $t_1$ and $t_2$, and the heights of these impulses are proportional to the coefficients of $t_1$ and $t_2$, in equation (4), as shown in FIG. 4C by waveform $\hat{I}_3(iii)$. Thus, the excitation of the adjoint circuit depends on optimization variable (s) which, in this particular example for $t_2$, is $\lambda$ (i.e., the Lagrange multiplier or dual variable). The adjoint circuit is solved and the convolution integrals carried out as explained above to yield the required sensitivities (i.e., gradients). Thus, in accordance with such a preferred method as applied to this example, a single solution of the adjoint circuit and a single set of convolution integrals can be used to replace the two solutions and two sets of convolution integrals required in the prior art methods. Advantageously, the teachings of such a preferred method of gradient computation may be extended to any circuit, any number of measurements, any optimization problem and any merit function, as will be explained.

The more general formulation for the case where the merit function $\Phi$ is a Lagrangian or augmented Lagrangian is presented below. It is to be appreciated that such a preferred method of gradient computation is applicable, however, to any differentiable merit function as will be explained following this formulation utilizing an augmented Lagrangian merit function. Assume that design parameters are $x_i$, $i=1,2,\ldots,n$ and the circuit measurements of interest are $m_j(x)$, $j=1,2\ldots p$. Further, assume that the optimization problem is stated as:

$$\text{minimize } f(m) \quad (20)$$

$$\text{subject to } c_k(m) = 0, k = 1, 2 \ldots, q,$$

where the objective function is a differential function of the measurements $f(m)$ and the constraints are differentiable functions of the measurements $c_k(m)$ k=1,2, . . . ,q. The above problem statement is general enough to express a maximization problem, or an objective function that is a differentiable function (or in particular, the weighted sum) of many measurements, or inequality constraints that have been recast as equalities by the addition of slack variables, or nonlinear sum-of-squares problems. Further, a straightforward Lagrangian merit function may be represented as:

$$\Phi = f(m) + \sum_{k=1}^{q} \lambda_k c_k(m), \quad (21)$$

where the $\lambda_k$ represent the Lagrange multipliers or dual variables. Still further, an augmented Lagrangian merit function with a quadratic penalty term may be represented as:

$$\Phi = f(m) + \sum_{k=1}^{q} \lambda_k c_k(m) + \frac{1}{2\mu} \sum_{k=1}^{q} c_k^2(m), \quad (22)$$

where $\mu$ is a penalty parameter that weights feasibility. The following example considers only the augmented Lagrangian Equation (22), since the Lagrangian form of Equation (21) is merely a special case thereof. Once the circuit has been evaluated at any particular iteration, all the function values are known. Then, the gradients may be represented as:

$$\frac{\partial \Phi}{\partial x_i} = \sum_{j=1}^{p} \frac{\partial f}{\partial m_j} \frac{\partial m_j}{\partial x_i} + \quad (23)$$

$$\sum_{k=1}^{q} \lambda_k \left( \sum_{j=1}^{p} \frac{\partial c_k}{\partial m_j} \frac{\partial m_j}{\partial x_i} \right) + \frac{1}{\mu} \sum_{k=1}^{q} \left( \sum_{j=1}^{p} \frac{\partial c_k}{\partial m_j} \frac{\partial m_j}{\partial x_i} \right) c_k,$$

$$i = 1, 2, \ldots, n,$$

which can be rewritten as:

$$\frac{\partial \Phi}{\partial x_i} = \sum_{j=1}^{p} \frac{\partial m_j}{\partial x_i} \left[ \frac{\partial f}{\partial m_j} + \sum_{k=1}^{q} \left( \lambda_k + \frac{c_k}{\mu} \right) \frac{\partial c_k}{\partial m_j} \right], \quad i = 1, 2, \ldots, n \quad (24)$$

$$= \sum_{j=1}^{p} w_j \frac{\partial m_j}{\partial x_i}, \quad i = 1, 2, \ldots, n$$

$$= \frac{\partial}{\partial x_i} \sum_{j=1}^{p} w_j m_j, \quad i = 1, 2, \ldots, n,$$

where the $w_j$ represent constant weight factors. Once the nominal circuit has been simulated or solved, the coefficients of $\partial m_j/\partial x_i$ are known and can therefore be treated as constant weight factors $w_j$ for the purposes of such a preferred method of gradient computation. These coefficients include $\lambda_k$, $f$, $c_k$, $\mu$, $\partial c_k/\partial m_j$ and $\partial f/\partial m_j$. Hence, the required gradients can be expressed as the gradients of a scalar weighted sum of measurements and, therefore, the gradients of the merit function with respect to all design parameters can be computed by means of a single adjoint analysis. In this adjoint analysis, the excitations of the adjoint circuit are chosen appropriately and scaled to incorporate the weights $w_j$ so that the sensitivity function of interest is in effect the composite merit function. It is to be appreciated that the above procedure preferably requires substantially close communication between the portion of the nonlinear optimizer which decides and updates values such as the Lagrange multipliers and penalty parameter and the simulation and gradient computation portion which controls the excitations that are applied to the adjoint circuit.

As previously mentioned, such a preferred method of gradient computation may be extended to general merit functions. As above, let the circuit measurements of interest be $m_j(x)$, $j=1,2,\ldots,p$ and let the optimization problem be as follows:

$$\text{minimize } f(m) \quad (25)$$

$$\text{subject to } c_k(m) = 0, k = 1, 2 \ldots, q,$$

where the objective function is a differentiable function of the measurements $f(m(x))$ and the constraints are differentiable functions of the measurements $c_k(m(x))$, $k=1,2,\ldots,q$. Let the merit function be any differentiable function of the constraints and objective function(s) $\Phi=g(f, c_1, c_2, \ldots, c_q)$. Then, the computation of the gradient $\partial\Phi/\partial x$ may be represented as follows:

$$\frac{\partial \Phi}{\partial x_i} = \frac{\partial g}{\partial f} \frac{\partial f}{\partial x_i} + \sum_{k=1}^{q} \frac{\partial g}{\partial c_k} \frac{\partial c_k}{\partial x_i}, \quad i = 1, 2, \ldots, n, \quad (26)$$

$$= \frac{\partial g}{\partial f} \left( \sum_{j=1}^{p} \frac{\partial f}{\partial m_j} \frac{\partial m_j}{\partial x_i} \right) + \sum_{k=1}^{q} \frac{\partial g}{\partial c_k} \left( \sum_{j=1}^{p} \frac{\partial c_k}{\partial m_j} \frac{\partial m_j}{\partial x_i} \right),$$

$$i = 1, 2, \ldots, n$$

$$= \sum_{j=1}^{p} w_j \frac{\partial m_j}{\partial x_i}, \quad i = 1, 2, \ldots, n$$

$$= \frac{\partial}{\partial x_i} \left( \sum_{j=1}^{p} w_j m_j \right), \quad i = 1, 2, \ldots, n.$$

Again, note that once the nominal circuit has been simulated or solved, the coefficients of the $\partial m_j/\partial x_i$ terms are known and can therefore be treated as constant weight factors $w_j$ for the purposes of gradient computation. In using the prior art adjoint method of computing circuit gradients, all $\partial m_j/\partial x_i$ terms for all values of i and one particular value of j can be computed at once by a single analysis of the associated adjoint circuit, as disclosed in the S. W. Director et al. article previously mentioned. However, disadvantageously, p solutions of the associated adjoint circuit are required to determine the $\partial m_j/\partial x_i$ terms for all values of j and all values of i. If time-domain gradient computation is necessary because the measurements are in the time-domain, then a total of n x p convolution integrals must be computed. Finally, the summations on the right hand side of Equation (26) are assembled.

However, in accordance with such a preferred method of gradient computation, Equation (26) is recognized to be the derivative of a scalar function of circuit measurements and, hence, the gradient of such a scalar function may advantageously be computed with respect to all design parameters at once, using a single adjoint analysis. Thus, instead of computing the $\partial m_j/\partial x_i$ terms individually as done in the prior art, such a preferred method provides for directly computing $\partial\Phi/\partial x_i$ for all values of i simultaneously by means of a single analysis of the associated adjoint circuit. Accordingly, only n convolution integrals are necessary for time-domain gradient computation. To first order, the computational speedup achieved over the traditional adjoint method is a factor of p. Thus, in accordance with such a preferred method, all the required gradients of the merit function with respect to all the design parameters may be computed by means of a single adjoint analysis.

It is also to be appreciated that while Equations (21) and (22) illustrate merit functions built for the purposes of a particular kind of optimization, the described method is applicable to find the gradients of any scalar function of measurements or responses (constructed for any type of optimization or other purpose) of any physical system or system of equations or differential equations.

Furthermore, it is to be appreciated that such a preferred gradient computation method used for circuit optimization may find many and varied practical applications. For instance, such a method may be employed in all computer-aided design (CAD) programs substantially targeted at circuit optimization. Also, such a preferred method is also applicable to gradient-based optimization of any system (e.g., linear or nonlinear, static or dynamic) in which the optimization merit function is a differentiable function of system measurements, and in which the gradients of such measurements, with respect to controllable variables, are amenable to being computed by an adjoint analysis. Further, such a preferred method may be employed to determine the gradients of any scalar function of measurements or responses of any nonlinear system or any system of nonlinear differential equations. Still further, such preferred methods for computing gradients discussed herein may be used for substantially any applicable purpose which may be contemplated by one of ordinary skill in the art and, therefore, it is to be understood that gradient-based optimization is merely one example of such applications.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed:

1. A method of gradient-based system optimization incorporating noise criteria, the method comprising the steps of:
    (a) specifying at least one noise criterion including, for each criterion, a measurement to be checked for noise, maximum allowable deviation and a sub-interval of time during which the checking is performed;
    (b) providing each noise criterion as one of a semi-infinite objective function and a semi-infinite constraint to be met;
    (c) specifying at least one variable of the optimization;
    (d) at least one of converting each noise objective function into a time-integral equality constraint by introduction of an auxiliary variable and converting each noise constraint into a time-integral equality constraint;
    (e) generating a merit function in order to solve the optimization problem;
    (f) one of simulating and solving the system to be optimized in the time-domain;
    (g) computing values of at least one of the objective functions and the constraints;
    (h) computing gradients of at least one of the objective functions and the constraints including contributions of the time-integrals representing the noise criteria;
    (i) providing at least one of the constraint values and the objective function values and their gradients to a non-linear optimizer; and
    (j) employing the nonlinear optimizer to update at least one variable of the optimization in order to improve the merit function.

2. The method of claim 1, further comprising the step of continuing the optimization iterations to obtain improvement in the system being optimized.

3. The method of claim 1, further comprising the step of specifying at least one criterion other than noise for optimization in terms of, for each criterion, one of an objective function and a constraint.

4. The method of claim 1, wherein the system is modeled by a set of equations.

5. The method of claim 1, wherein the system to be optimized is a network.

6. The method of claim 1, wherein the system to be optimized is an electrical digital circuit.

7. The method of claim 1, wherein the system to be optimized is an electrical analog circuit.

8. The method of claim 1, wherein the gradients of the merit function are computed by an adjoint method of gradient computation.

9. The method of claim 1, wherein step (h) is replaced by computing the gradients of the merit function in a single adjoint analysis and wherein these gradients are provided to the non-linear optimizer in step (i).

10. The method of claim 1, wherein said optimization is applied to one of single criterion and multiple criteria optimization.

11. The method of claim 1, wherein the merit function is one of a Lagrangian merit function, an augmented Lagrangian merit function, a penalty function and a barrier function.

12. Computer-based apparatus for performing gradient-based system optimization incorporating noise criteria, the computer-based process comprising the steps of:
    (a) specifying at least one noise criterion to be met including, for each criterion, a measurement to be checked for noise, maximum allowable deviation and a sub-intervals of time during which the checking is performed;
    (b) providing each noise criterion as one of a semi-infinite objective function and a semi-infinite constraint;
    (c) specifying at least one variable of the optimization;
    (d) at least one of converting each noise objective function into a time-integral equality constraint by introduction of an auxiliary variable and converting each noise constraint into a time-integral equality constraint;
    (e) generating a merit function in order to solve the optimization problem;
    (f) one of simulating and solving the system to be optimized in the time-domain;
    (g) computing values of at least one of the objective functions and constraints;
    (h) computing gradients of at least one of the objective functions and the constraints including contributions of the time-integrals representing the noise criteria;
    (i) providing at least one of the constraint values and the objective function values and their gradients to a nonlinear optimizer; and
    (j) employing the nonlinear optimizer to update at least one variable of the optimization in order to improve the merit function.

13. The apparatus of claim 12, further comprising the step of continuing the optimization iterations to obtain improvement in the system being optimized.

14. The apparatus of claim 12, further comprising the step of specifying at least one criterion other than noise for optimization in terms of, for each criterion, one of an objective function and a constraint.

15. The apparatus of claim 12, wherein the system is modeled by a set of equations.

16. The apparatus of claim 12, wherein the system to be optimized is a network.

17. The apparatus of claim 12, wherein the system to be optimized is an electrical digital circuit.

18. The apparatus of claim 12, wherein the system to be optimized is an electrical analog circuit.

19. The apparatus of claim 12, wherein the gradients of the merit function are computed by an adjoint method of gradient computation.

20. The apparatus of claim 12, wherein step (h) is replaced by computing the gradients of the merit function in a single adjoint analysis and wherein these gradients are provided to the non-linear optimizer in step (i).

21. The apparatus of claim 12, wherein said optimization is applied to one of single criterion and multiple criteria optimization.

22. The apparatus of claim 12, wherein the merit function is one of a Lagrangian merit function, an augmented Lagrangian merit function, a penalty function and a barrier function.

23. A method of gradient-based circuit optimization incorporating noise criteria, the method comprising the steps of:

(a) specifying a circuit to be optimized;

(b) specifying delay, power, area and rise/fall time criteria for optimization in terms of at least one of an objective function and a set of constraints;

(c) specifying noise criteria for the circuit to meet, including signals to be checked for noise, maximum allowable deviations and sub-intervals of time during which the checking is to be performed;

(d) providing each noise criterion as one of a semi-infinite constraint and a semi-infinite objective function;

(e) specifying at least one variable of the optimization;

(f) at least one of converting the semi-infinite noise constraints into time-integral constraints and converting the semi-infinite objective functions into time-integral equality constraints with the introduction of an auxiliary variable;

(g) creating an augmented Lagrangian merit function to be minimized to solve the optimization problem;

(h) simulating the circuit in the time-domain by means of a fast event-driven circuit simulator;

(i) computing values of at least one of the objective functions and the constraints;

(j) efficiently computing the gradients of the augmented Lagrangian merit function, including contributions of at least one of the objective functions and the constraints and the time-integrals representing noise, by means of a single adjoint analysis performed by the fast simulator;

(k) providing at least one of the constraint values and the objective function values and the gradients of the merit function to a nonlinear optimizer; and (l) continuing the optimization iterations to convergence.

* * * * *

UNITED STATES PATENT AND TRADEMARK OFFICE
CERTIFICATE OF CORRECTION

PATENT NO. : 5,999,714
DATED : December 7, 1999
INVENTOR(S) : Andrew Roger Conn, Rudolf Adriaan Haring, Chandramouli Visweswariah It is certified that error appears in the above-identified patent and that said Letters Patent is hereby corrected as shown below:

Column 7:
Line 17 delete "$V_{NI}$" and replace it with --$V_{N1}$--.
Line 37 delete "$V_{NI}$" and replace it with --$V_{N1}$--.
Line 47 delete "$t_o$" and replace it with --$t_\emptyset$--.
Line 56 delete "t " and replace it with --$t_\emptyset$--.

Column 8:
Line 5 delete "$f_{t1}$" and replace it with --$\int_{t1}$--.
Line 5 delete "$f_{ts}$" and replace it with --$\int_{ts}$--.
Line 8 delete "$V_{NI}$" and replace it with --$V_{N1}$--.
Line 12 delete "$V_{NI}$" and replace it with --$V_{N1}$--.

Column 9:
Line 28 delete "-1" and replace it with --1--.
Line 28 delete "-$NM_H$" and replace it with --$NM_L$.

Line 35 delete "$k_{2_o}$" and replace it with --$k_{2_\emptyset}$--.

Line 35 delete "$t_{1_o}$" and replace it with --$t_{1_\emptyset}$--.

Line 35 delete "$t_{2_o}$" and replace it with --$t_{2_\emptyset}$--.

Line 51 delete "$\int_{t_{1_o}}^{t_{2_o}}$" and replace it with. --$\int_{t_{1_\emptyset}}^{t_{2_\emptyset}}$--

Line 51 delete "$k_{2_o}$" and replace it with --$k_{2_\emptyset}$--.

UNITED STATES PATENT AND TRADEMARK OFFICE
CERTIFICATE OF CORRECTION

PATENT NO. : 5,999,714
DATED : December 7, 1999
INVENTOR(S) : Andrew Roger Conn, Rudolf Adriaan Haring, Chandramouli Visweswariah It is certified that error appears in the above-identified patent and that said Letters Patent is hereby corrected as shown below:

Column 10:
Line 2 delete, " $k_{2_o}$ " and replace it with -- $k_{2_\varnothing}$ --.

Line 3 delete, " $t_{1_o}, t_{2_o}$ " and replace it with -- $t_{1_\varnothing}, t_{2_\varnothing}$ --.

Line 12 delete, "N=" and replace it with --$\leq$--.
Line 65 delete, "Z" and replace it with --z--.
Line 67 add, --n=o--.

Column 11:
Line 7 delete, indent and change font to normal text font.

Column 13:
Line 38 delete, "$f$" and replace it with --$\int$--.

Column 14:
Line 1 delete, " $\frac{\partial \Phi}{\partial x_i} \frac{\partial}{\partial x_i}$ " and place it with -- $\frac{\partial \Phi}{\partial x_i} = \frac{\partial}{\partial x_i}$ --.

Line 15 delete, "(4)" and replace it with --(19)--.

Signed and Sealed this

Thirty first Day of July, 2001

*Attest:*

*Attesting Officer*

NICHOLAS P. GODICI
*Acting Director of the United States Patent and Trademark Office*